(12) United States Patent
Chern et al.

(10) Patent No.: US 12,484,316 B2
(45) Date of Patent: Nov. 25, 2025

(54) CVD BORON UNIFORMITY OVERCOMING LOADING EFFECTS

(71) Applicant: KLA Corporation, Milpitas, CA (US)

(72) Inventors: Jehn-Huar Howard Chern, Morgan Hill, CA (US); Marcel Trimpl, San Jose, CA (US); David L. Brown, Los Gatos, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 18/968,641

(22) Filed: Dec. 4, 2024

(65) Prior Publication Data

US 2025/0280611 A1 Sep. 4, 2025

Related U.S. Application Data

(60) Provisional application No. 63/559,866, filed on Feb. 29, 2024.

(51) Int. Cl.
*H10F 30/295* (2025.01)

(52) U.S. Cl.
CPC .................. *H10F 30/295* (2025.01)

(58) Field of Classification Search
CPC .................................................... H10F 30/295
See application file for complete search history.

(56) References Cited

U.S. PATENT DOCUMENTS

| | | |
|---|---|---|
| 6,555,166 B2 | 4/2003 | Gluschenkov et al. |
| 7,586,108 B2 | 9/2009 | Nihtianov et al. |
| 8,450,820 B2 | 5/2013 | Nanver et al. |
| 9,818,887 B2 | 11/2017 | Chern et al. |
| 10,197,501 B2 | 2/2019 | Chuang et al. |
| 10,199,197 B2 | 2/2019 | Chuang et al. |
| 10,269,842 B2 | 4/2019 | Muramatsu et al. |
| 10,466,212 B2 | 11/2019 | Brown et al. |
| 11,088,190 B2 | 8/2021 | Muramatsu et al. |
| 11,114,489 B2 | 9/2021 | Chuang et al. |
| 11,239,048 B2 | 2/2022 | Brodie et al. |
| 11,699,607 B2 | 7/2023 | Gerling et al. |
| 11,848,350 B2 | 12/2023 | Haddadi et al. |
| 2016/0300701 A1 | 10/2016 | Chuang et al. |
| 2020/0212246 A1 | 7/2020 | Lorito et al. |

(Continued)

FOREIGN PATENT DOCUMENTS

| | | |
|---|---|---|
| EP | 1995761 B1 | 12/2018 |
| KR | 1020060000105 A | 1/2006 |

OTHER PUBLICATIONS

Korean Intellectual Property Office, International Search Report and Written Opinion received in International Application No. PCT/US2025/017265, Jun. 4, 2025, 7 pages.

(Continued)

*Primary Examiner* — Matthew L Reames
(74) *Attorney, Agent, or Firm* — Suiter Swantz IP

(57) ABSTRACT

The loading effects of boron layers on silicon within a window may be reduced or eliminated by depositing an adhesion layer on a dielectric layer before depositing the boron layer. The adhesion layer may reduce or eliminate lateral diffusion of boron species into the window by being deposited on the adhesion layer. The approach using the adhesion layer may enable forming the boron layer at the nanometer scale within windows which are at the tens of millimeters scale and below. The boron layer and the silicon layer may form a detector which may be used in scanning electron microscopes and the like.

29 Claims, 15 Drawing Sheets

(56) References Cited

U.S. PATENT DOCUMENTS

| | | |
|---|---|---|
| 2023/0230800 A1 | 7/2023 | Trimpl |
| 2023/0266488 A1 | 8/2023 | Wiest |
| 2024/0243143 A1 | 7/2024 | Butaeva et al. |
| 2024/0250110 A1 | 7/2024 | Haddadi et al. |
| 2024/0313032 A1 | 9/2024 | Yalamanchili et al. |

OTHER PUBLICATIONS

Kolahdouz et al., "B-doped SiGe(C) Materials for High Performance Devices," Jan. 2010, 54 pages.

Kolahdouz et al., "Comprehensive Evaluation and Study of Pattern Dependency Behavior in Selective Epitaxial Growth of B-Doped SiGe Layers," IEEE Transactions on Nanotechnology, vol. 8, No. 3, May 2009, 8 page.

Kolahdouz et al., "Selective Epitaxial Growth with Full Control of Pattern Dependency Behavior for pMOSFET Structures," Journal of The Electrochemical Society, 156 (3), Jan. 8, 2009, 4 pages.

Kolahdouz et al., "Selective Growth of B- and C-Doped SiGe Layers in Unprocessed and Recessed Si Openings for p-type Metal-Oxide-Semiconductor Field-Effect Transistors Application," Journal of The Electrochemical Society, 157 (6), Apr. 23, 2010, 6 pages.

Menon et al., "Loading effect in SiGe layers grown by dichlorosilane- and silane-based epitaxy," Journal of Applied Physics, vol. 90, No. 9, Nov. 1, 2001, 6 pages.

Mohammadi et al., "Pattern Dependency and Loading Effect of Pure-Boron-Layer Chemical-Vapor Deposition," ECS Journal of Solid State Science and Technology, vol. 1, Issue 1, Jul. 17, 2012, 7 pages.

Saito, "Characteristics of Plasmaless Dry Etching of Silicon-Related Materials Using Chlorine Trifluoride Gas," Sensors and Materials, vol. 14, No. 5, Feb. 12, 2002, 7 pages.

Sarubbi et al., "Pure Boron-Doped Photodiodes: a Solution for Radiation Detection in EUV Lithography," Conference Paper, Oct. 2008, 5 pages.

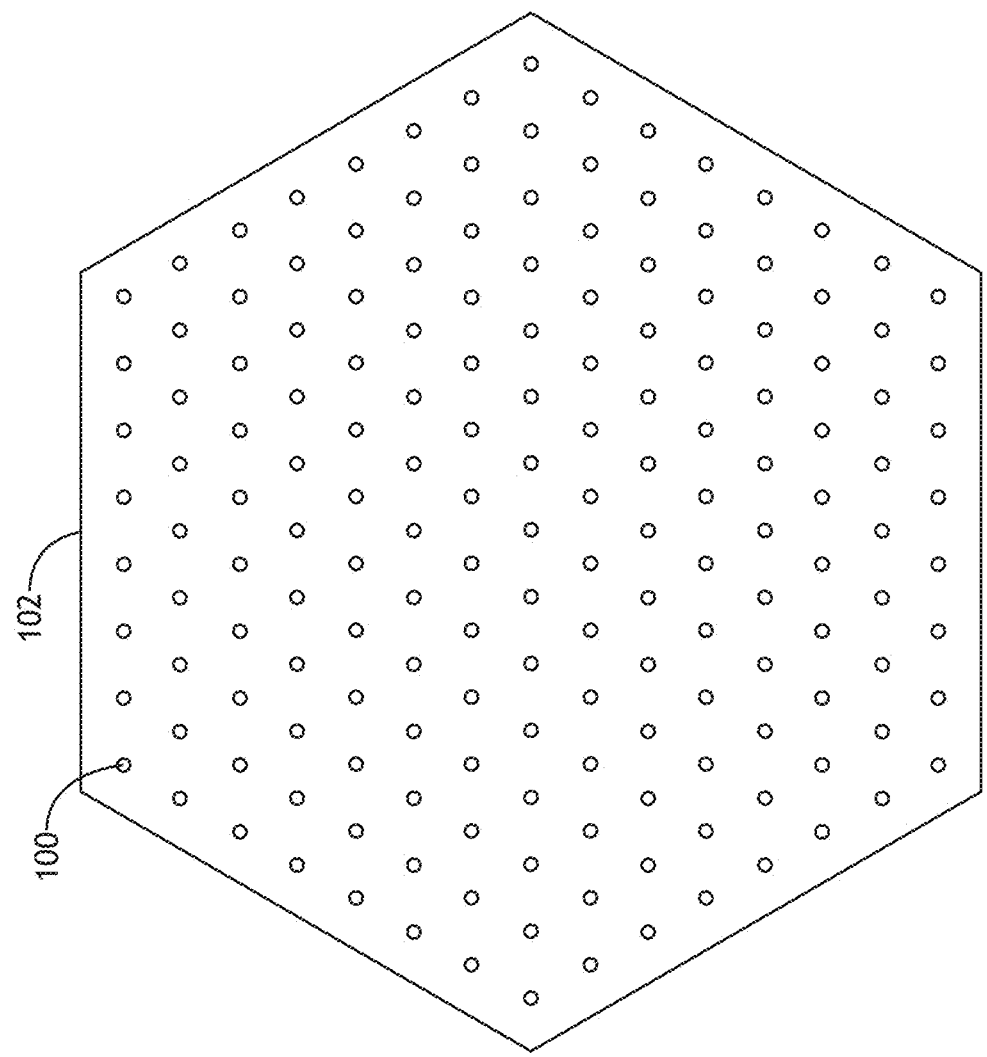

CVD BORON UNIFORMITY OVERCOMING LOADING EFFECTS

CROSS REFERENCE TO RELATED APPLICATION

The present application claims the benefit under 35 U.S.C. § 119 (e) of U.S. Provisional Application Ser. No. 63/559,866, filed Feb. 29, 2024, titled "Improvement to CVD boron deposition uniformity due to loading effects", which is incorporated herein by reference in the entirety.

TECHNICAL FIELD

The present disclosure generally relates to solid-state semiconductor devices, and more particularly to electron and photon detectors for high-speed scanning in electron or optical microscopy applications.

BACKGROUND

Pure boron layers at nanometer-scale thicknesses may experience pattern dependency and loading effects when deposited on silicon within patterned windows. The deposition rate of pure boron using chemical vapor deposition (CVD) can vary over a wafer depending on the silicon opening size and oxide coverage ratio (OCR) of the mask design. The higher the oxide coverage ratio, the higher the deposition rate. The rate also increases as the sizes of the windows to the silicon decrease due to the local loading effect. The chemical vapor deposition process may experience a vertical diffusion from a boundary layer and a lateral diffusion along the oxide. Floating boron atoms laterally diffuse over the dielectric creating a higher concentration of boron atoms at the silicon-dielectric interface. Consequently, there is an increase of boron atoms sticking to the silicon surface in the proximity of the open windows. The loading effects may cause the thickness of the pure boron layers to vary over the width of the window and/or between multiple windows of different sizes. The variation in the thickness may render the pure boron layer ineffective for use in detectors as the width of the window decreases.

One method for reducing the localized loading effects is to decrease diborane partial pressure as well as carrier gas flow. The reduction of the pattern dependency with decreasing diborane partial pressure as well as carrier gas flow, have been applied to diodes with active areas on the order of hundreds of millimeters.

Some detector applications need high bandwidth detection, meaning the windows must be decreased. For high-speed diodes on the order of hundreds of MHz where drift times need to be optimized, small active areas are preferred, leading to a higher fraction of areas that are covered by dielectrics compared to the total area. Controlling the diborane partial pressure and the carrier gas flow may be inadequate to remedy the local loading effects for the small active areas. Therefore, it would be advantageous to provide a device, system, and method that cures the shortcomings described above.

SUMMARY

A detector is described in accordance with one or more embodiments of the present disclosure. In some embodiments, the detector may include: a silicon layer, wherein the silicon layer is monocrystalline silicon and an n-type semiconductor; an epitaxial layer, wherein the epitaxial layer is deposited on the silicon layer; a dielectric layer, wherein the dielectric layer is deposited on the epitaxial layer; an adhesion layer, wherein the adhesion layer is deposited on the dielectric layer, wherein the dielectric layer and the adhesion layer define a window to the epitaxial layer; and boron layers including an upper boron layer and a lower boron layer, wherein the upper boron layer is deposited on the adhesion layer, wherein the lower boron layer is deposited on the epitaxial layer within the window, wherein the boron layers are p-type semiconductors, wherein the upper boron layer is separated from the lower boron layer by the dielectric layer, wherein the lower boron layer includes a boron concentration of at least 80 percent, wherein the lower boron layer is a pinhole-free film, wherein at least one of an electron or a photon is configured to penetrate the lower boron layer, wherein the lower boron layer, the epitaxial layer, and the silicon layer form a p-n diode by which the detector is configured to detect at least one of the electron or the photon.

A method is described in accordance with one or more embodiments of the present disclosure. In some embodiments, the method may include: depositing an epitaxial layer on a silicon layer, wherein the silicon layer is monocrystalline silicon and an n-type semiconductor; depositing a dielectric layer on the epitaxial layer; depositing an adhesion layer on the dielectric layer; etching a window through the adhesion layer and the dielectric layer to the epitaxial layer; and depositing boron layers, the boron layers including an upper boron layer and a lower boron layer, wherein the upper boron layer is deposited on the adhesion layer, wherein the lower boron layer is deposited on the epitaxial layer within the window, wherein the boron layers are p-type semiconductors, wherein the upper boron layer is separated from the lower boron layer by the dielectric layer, wherein the lower boron layer includes a boron concentration of at least 80 percent, wherein the lower boron layer is a pinhole-free film, wherein at least one of an electron or a photon is configured to penetrate the lower boron layer, wherein the lower boron layer, the epitaxial layer, and the silicon layer form a p-n diode by which the detector is configured to detect at least one of the electron or the photon.

A scanning electron microscope is described in accordance with one or more embodiments of the present disclosure. In some embodiments, the scanning electron microscope may include: a detector including: a silicon layer, wherein the silicon layer is monocrystalline silicon and an n-type semiconductor; an epitaxial layer, wherein the epitaxial layer is deposited on the silicon layer; a dielectric layer, wherein the dielectric layer is deposited on the epitaxial layer; an adhesion layer, wherein the adhesion layer is deposited on the dielectric layer, wherein the dielectric layer and the adhesion layer define a window to the epitaxial layer; and boron layers including an upper boron layer and a lower boron layer, wherein the upper boron layer is deposited on the adhesion layer, wherein the lower boron layer is deposited on the epitaxial layer within the window, wherein the boron layers are p-type semiconductors, wherein the upper boron layer is separated from the lower boron layer by the dielectric layer, wherein the lower boron layer includes a boron concentration of at least 80 percent, wherein the lower boron layer is a pinhole-free film, wherein at least one of an electron or a photon is configured to penetrate the lower boron layer, wherein the lower boron layer, the epitaxial layer, and the silicon layer form a p-n diode by which the detector is configured to detect at least one of the electron or the photon.

A detector array is described, in accordance with one or more embodiments of the present disclosure. In some embodiments, the detector array may include an array of detectors, the array of detectors may include a silicon layer, wherein the silicon layer is monocrystalline silicon and an n-type semiconductor; an epitaxial layer, wherein the epitaxial layer is deposited on the silicon layer; a dielectric layer, wherein the dielectric layer is deposited on the epitaxial layer; an adhesion layer, wherein the adhesion layer is deposited on the dielectric layer, wherein the dielectric layer and the adhesion layer define a window to the epitaxial layer; and boron layers including an upper boron layer and a lower boron layer, wherein the upper boron layer is deposited on the adhesion layer, wherein the lower boron layer is deposited on the silicon layer within the window, wherein the boron layers are p-type semiconductors, wherein the upper boron layer is separated from the lower boron layer by the dielectric layer, wherein the lower boron layer includes a boron concentration of at least 80 percent, wherein the lower boron layer is a pinhole-free film, wherein at least one of an electron or a photon is configured to penetrate the lower boron layer, wherein the lower boron layer, the epitaxial layer, and the silicon layer form a p-n diode by which the detector is configured to detect at least one of the electron or the photon.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the description and drawings serve to explain the principles of the disclosure.

BRIEF DESCRIPTION OF THE DRAWINGS

The numerous advantages of the disclosure may be better understood by those skilled in the art by reference to the accompanying figures in which:

FIG. 6 depicts a top view of a detector array, in accordance with one or more embodiments of the present disclosure.

DETAILED DESCRIPTION

Figure 1A:
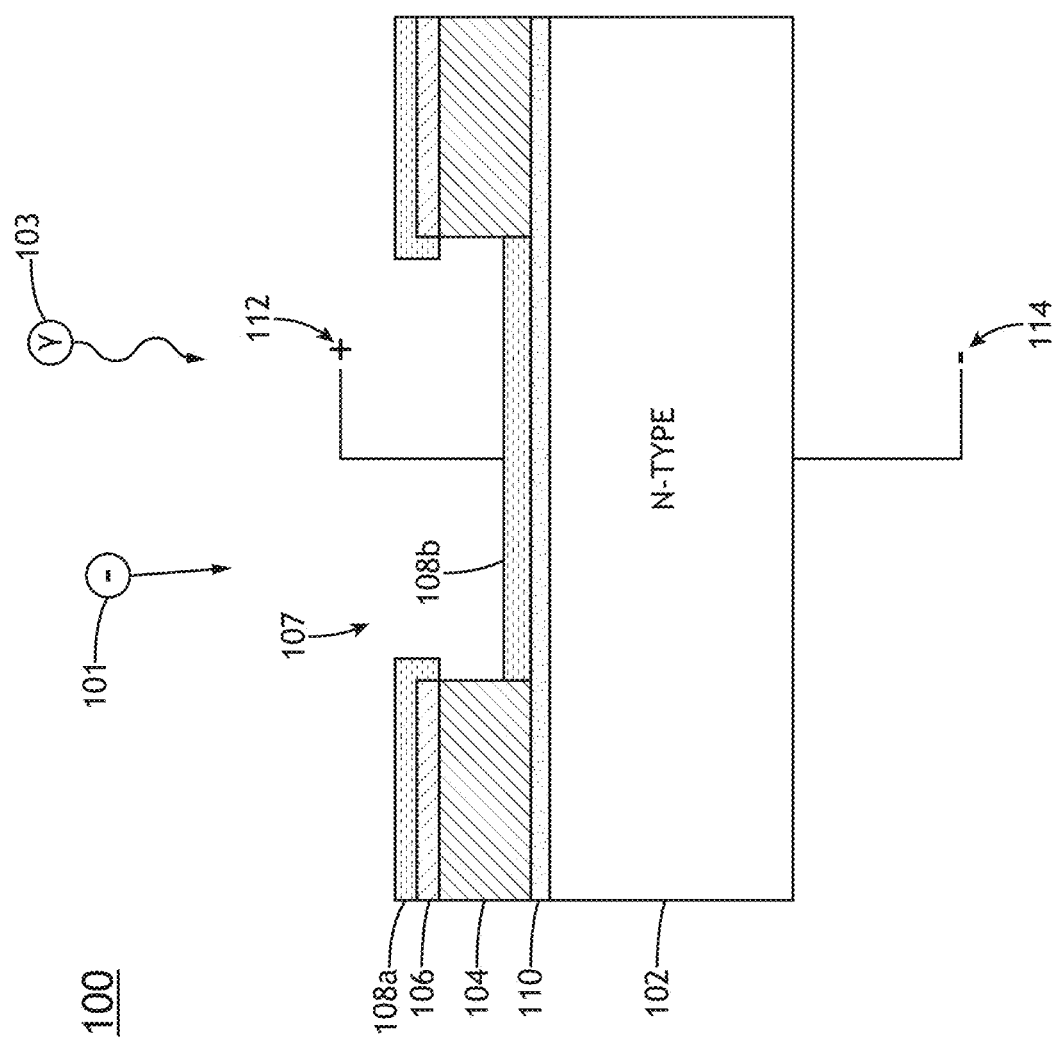
FIG. 1A depicts a cross-section view of a detector, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Embodiments of the present disclosure are directed to improving chemical vapor deposition (CVD) boron uniformity overcoming loading effects. The loading effects of boron layers on silicon within a window may be reduced or eliminated by depositing an adhesion layer on a dielectric layer before depositing the boron layer. The adhesion layer may reduce or eliminate lateral diffusion of boron species into the window by being deposited on the adhesion layer. The approach using the adhesion layer may enable forming the boron layer at the nanometer scale within windows which are at the tens of millimeters scale and below. The boron layer and the silicon layer may form a detector which may be used in scanning electron microscopes and the like.

U.S. Pat. No. 6,555,166B2, titled "Method for reducing the microloading effect in a chemical vapor deposition reactor"; U.S. Pat. No. 7,586,108B2, titled "Radiation detector, method of manufacturing a radiation detector and lithographic apparatus comprising a radiation detector"; U.S. Pat. No. 8,450,820B2, titled "Radiation detector"; U.S. Pat. No. 9,818,887B2, titled "Back-illuminated sensor with boron layer"; U.S. Pat. No. 10,197,501B2, titled "Electron-bombarded charge-coupled device and inspection systems using EBCCD detectors"; U.S. Pat. No. 10,199,197B2, titled "Photocathode including silicon substrate with boron layer"; U.S. Pat. No. 10,269,842B2, titled "Anti-reflection layer for back-illuminated sensor"; U.S. Pat. No. 10,466,212B2, titled "Scanning electron microscope and methods of inspecting and reviewing samples"; U.S. Pat. No. 11,088,190B2, titled "Optical semiconductor device"; U.S. Pat. No. 11,114,489B2, titled "Back-illuminated sensor and a method of manufacturing a sensor"; U.S. Pat. No. 11,239,048B2, titled "Arrayed column detector"; U.S. Pat. No. 11,699,607B2, titled "Segmented multi-channel, backside illuminated, solid state detector with a through-hole for detecting secondary and backscattered electrons"; U.S. Pat. No. 11,848,350B2, titled "Back-illuminated sensor and a method of manufacturing a sensor using a silicon on insulator wafer"; U.S.

Patent Publication Number US20200212246A1, titled "Semiconductor detector and method of fabricating same"; U.S. Patent Publication Number US20230230800A1, titled "Sensor module for scanning electron microscopy applications"; U.S. Patent Publication Number US20240243143A1, titled "Boron-Coated Back-Illuminated Image Sensor With Fluoride-Based Anti-Reflection Coating"; U.S. Patent Publication Number US20240250110A1, titled "Image sensors with a tunable floating diffusion structure"; U.S. Patent Publication Number US20240313032A1, titled "Back-Illuminated Sensor With Boron Layer Deposited Using Plasma Atomic Layer Deposition"; are each incorporated herein by reference in the entirety.

Figure 1B:
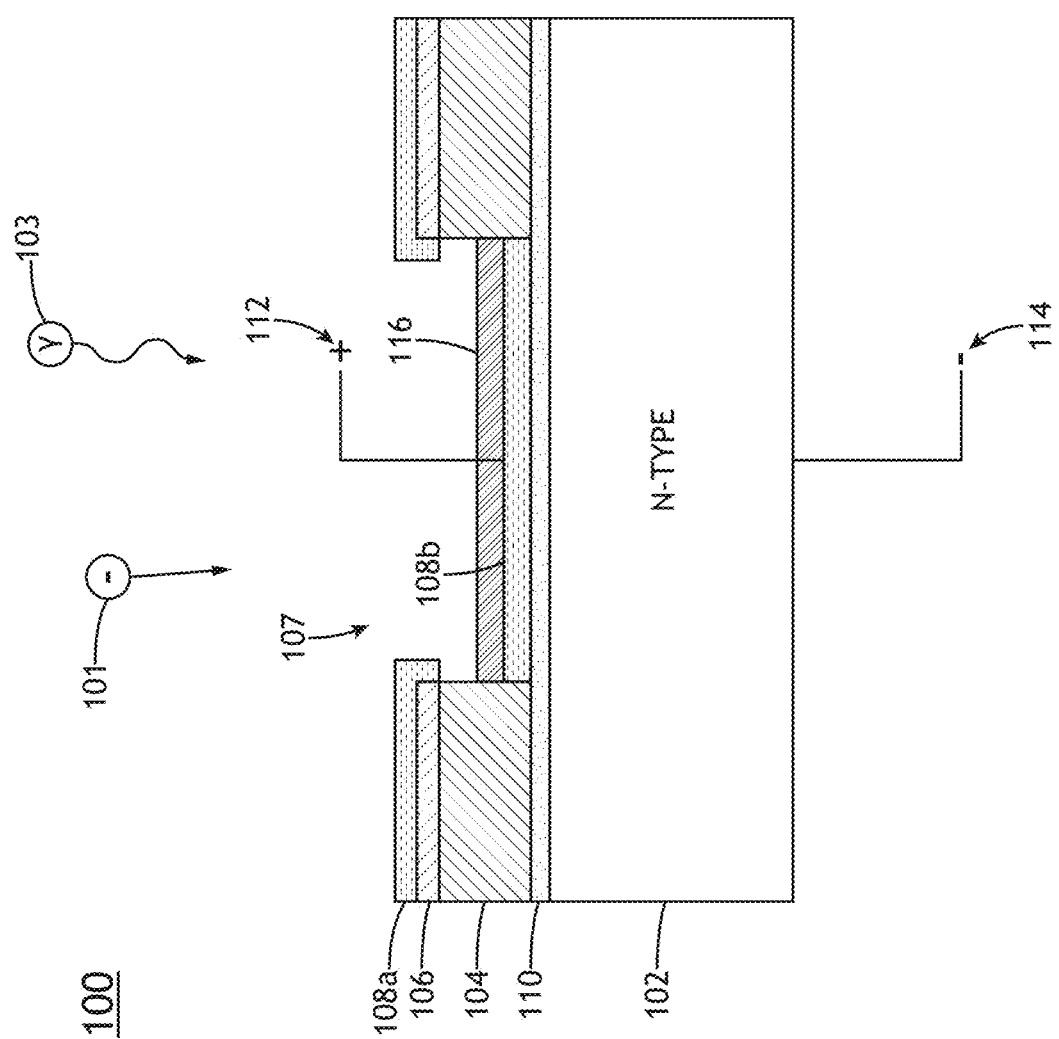
FIG. 1B depicts the cross-section view of the detector with a capping layer, in accordance with one or more embodiments of the present disclosure.

FIGS. 1A-1B depicts a detector 100, in accordance with one or more embodiments of the present disclosure. The detector 100 may be configured to detect electrons 101 and/or photons 103. The photons 103 may include vacuum-ultraviolet (VUV) light and/or soft X-rays where the detector 100 is configured as a photon detector. The detector 100 may include a silicon layer 102, a dielectric layer 104, an adhesion layer 106, boron layers 108, an epitaxial layer 110, an anode 112, a cathode 114, and/or a capping layer 116.

The silicon layer 102 may be monocrystalline silicon (i.e., monosilicon). The silicon layer 102 may be an n-type semiconductor. The silicon layer 102 may be silicon doped with donor atoms to be the n-type semiconductor. The silicon layer 102 may be doped with any suitable donor atom, such as, but not limited to, phosphorous, arsenic, or the like. The silicon layer 102 may include a select doping concentration of the donor atoms. The silicon layer 102 may be heavily doped with the donor atoms. The silicon layer 102 may be an (n+)-type semiconductor.

The silicon layer 102 may be a substrate over which the dielectric layer 104, the adhesion layer 106, the boron layers 108, the epitaxial layer 110, the anode 112, the cathode 114, and/or the capping layer 116 are deposited.

The epitaxial layer 110 may be an n-type semiconductor. The epitaxial layer 110 may be doped with a select concentration of the donor atoms. The epitaxial layer 110 may be lightly doped. The epitaxial layer 110 may be a (n−)-type semiconductor. The doping concentration of the epitaxial layer 110 may be less than the doping concentration of the silicon layer 102. For example, the doping concentration of the epitaxial layer 110 may be an order of magnitude smaller than the silicon layer 102.

The epitaxial layer 110 may be deposited on the silicon layer 102. The epitaxial layer 110 may be disposed between and couple the silicon layer 102 and either or both the dielectric layer 104 and/or the lower boron layer 108b.

The dielectric layer 104 may be a dielectric material. The dielectric layer 104 may be any silicon-based dielectric material. For example, the dielectric layer 104 may be silicon oxide (e.g., silicon dioxide), silicon nitride, or the like. In embodiments, the dielectric layer 104 is silicon oxide. The silicon oxide may be amorphous.

The dielectric layer 104 may be deposited on the epitaxial layer 110. The dielectric layer 104 may be disposed between and couple the epitaxial layer 110 and the adhesion layer 106.

The adhesion layer 106 may be material that may react with boron to consume diborane radicals. The adhesion layer 106 may be a material on which diborane gas may be decomposed and deposited at the same or similar rates as on the epitaxial layer 110. The adhesion layer 106 may be a Group IV material, such as carbon, silicon, germanium, tin, lead, or a combination thereof. In embodiments, the adhesion layer 106 may be a silicon-based Group IV material. The silicon-based Group IV material includes silicon, may include another Group IV material, and may not include any other materials which are not Group IV materials. For example, the adhesion layer 106 may be polycrystalline silicon (i.e., polysilicon), silicon germanium (SiGe), silicon carbide (SiC), silicon tin (SiSn), silicon lead (SiPb), or the like. In embodiments, the adhesion layer 106 is polycrystalline silicon. The polycrystalline silicon may be amorphous. It is contemplated that polycrystalline silicon may be advantageous due to boron being deposited on the polycrystalline silicon and monocrystalline silicon at the same rate.

The adhesion layer 106 may be deposited on the dielectric layer 104. The adhesion layer 106 may be disposed between and couple the dielectric layer 104 and the boron layer 108.

The adhesion layer 106 may include a select thickness. The thickness of the adhesion layer 106 may be on the order of hundreds of nanometers or micrometers (e.g., between 100 nm and 9 μm). For example, the thickness of the adhesion layer 106 may be on the order of hundreds of nanometers (e.g., between 100 nm and 999 nm). The thickness of the adhesion layer 106 may not control the deposition rate of the boron layer 108 on the adhesion layer 106. Thus, the adhesion layer 106 may be made as thin as possible with no effects on the performance of the detector 100. For example, the adhesion layer 106 was experimentally verified to enable the deposition of the boron layer 108 on the adhesion layer 106 with thicknesses as small as 100 nm and 200 nm.

A window 107 may be defined by the dielectric layer 104 and the adhesion layer 106. Sides of the dielectric layer 104 and the adhesion layer 106 may define the window 107. The window 107 may be defined through the dielectric layer 104 and the adhesion layer 106 to the epitaxial layer 110. The dielectric layer 104 and the adhesion layer 106 may be etched to define the window 107. The window 107 may or may not be defined through at least a portion of the epitaxial layer 110. For example, the portion of the epitaxial layer 110 may or may not be etched with the dielectric layer 104 and the adhesion layer 106 during etching.

The window 107 may include a width. The width of the window may be a distance between the sides of the dielectric layer 104 and/or the adhesion layer 106 defining the window 107. The width of the window 107 may be on the order of hundreds of micrometers, millimeters, tens of millimeters, or hundreds of millimeters (e.g., between 100 μm and 999 mm). In embodiments, the width of the window 107 may be on the order of hundreds of micrometers, millimeters, or tens of millimeters (e.g., between 100 μm and 99 mm). In embodiments, the width of the window 107 may be on the order of hundreds of micrometers or millimeters (e.g., between 100 μm and 9 mm). The window 107 has been experimentally verified for widths as small as 600 μm. The adhesion layer 106 may enable the width of the window 107 to be smaller than hundreds of millimeters while reducing the thickness of the boron layer 108, as will be described further herein. Reducing the width of the window 107 may cause the detector 100 to be smaller than existing detectors and/or provide high bandwidth detection.

The width of the window 107 may be constant or vary along a height of the window 107. For example, the sides of the dielectric layer 104 and/or the adhesion layer 106 may be flat such that the width of the window 107 may be constant (as depicted). By way of another example, the sides of the dielectric layer 104 and/or the adhesion layer 106 may be beveled such that the width of the window 107 may decrease from the top of the adhesion layer 106 to the epitaxial layer 110.

The boron layers 108 may be amorphous. The boron layers 108 may also be a p-type semiconductor. The boron layers 108 may be heavily doped. For example, the boron layers 108 may be a (p+)-type semiconductor.

The boron layers 108 may be high-purity boron. The boron layers 108 may include a high concentration of boron. For example, the boron layers 108 may include a boron concentration of at least 80 percent, with inter-diffused silicon and oxygen predominantly making up the remaining percentage. In embodiments, the boron layers 108 may be a pure boron layer (e.g., pure-B). For example, the boron layers 108 may include a boron concentration of at least 95 percent. For instance, the boron layers 108 may include a boron concentration of at least 99 percent. The purity of the lower boron layer 108b may be important for the sensitivity and lifetime of the detector 100. If the boron layers 108 includes a native oxide, the native oxide may be affected by the electrons 101 and/or photons 103 and may cause a degradation of performance. Therefore, increasing the boron concentration may be desirable.

The boron layers 108 may be deposited on the epitaxial layer 110 within the window 107 and/or on the adhesion layer 106. The boron layers 108 may include an upper boron layer 108a and/or a lower boron layer 108b. The upper boron layer 108a may be deposited on the adhesion layer 106. The lower boron layer 108b may be deposited on the epitaxial layer 110 within the window 107. A portion of the upper boron layer 108a deposited on the adhesion layer 106 may or may not overhang and be deposited on the sides of the adhesion layer 106 defining the window 107.

The boron layers 108 may not be deposited on the dielectric layer 104. The upper boron layer 108a may be separated from the lower boron layer 108b by the dielectric layer 104. Thus, the dielectric layer 104 may insulate the upper boron layer 108a from the lower boron layer 108b. Insulating the upper boron layer 108a from the lower boron layer 108b may be advantageous to maintain functionality of the detector 100 (e.g., to allow holes to move to the lower boron layer 108b as will be described further herein).

The lower boron layer 108b may include a select thickness. The thickness of the lower boron layer 108b may depend on the intended application for the detector 100. The thickness of the lower boron layer 108b may be on the order of nanometers or tens of nanometers (e.g., between 1 nm and 99 nm). The thickness of the lower boron layer 108b may be between a minimum thickness tolerance and a maximum thickness tolerance. For example, the thickness of the lower boron layer 108b may be between 2 nm and 20 nm. For instance, the thickness of the lower boron layer 108b may be between 2 nm and 10 nm. In embodiments, the thickness of the lower boron layer 108b may be between 2 nm and 5 nm. In embodiments, the thickness of the lower boron layer 108b may be between 2 nm and 3 nm.

The lower boron layer 108b may be a pinhole-free film. Providing the thickness of the lower boron layer 108b above the minimum thickness tolerance may cause the lower boron layer 108b to be the pinhole-free film. A thickness of 2 nm or greater may ensure the lower boron layer 108b is pinhole-free. The pinhole-free film may prevent oxygen from passing through the lower boron layer 108b to the epitaxial layer 110 and oxidizing, thereby reducing the sensitivity and/or lifetime of the detector 100.

The electrons 101 and/or the photons 103 may penetrate the lower boron layer 108b. Providing the thickness of the lower boron layer 108b below the maximum thickness tolerance may allow the penetration through the lower boron layer 108b by the electrons 101 and/or the photons 103. The maximum thickness tolerance of the lower boron layer 108b may be less than the penetration depth of the electrons 101 and/or the photons 103. Reducing the thickness of the lower boron layer 108b below the maximum thickness tolerance may also be beneficial to improve the sensitivity and/or responsivity of the detector 100.

The upper boron layer 108a may also include a select thickness. The thickness of the upper boron layer 108a may be on the order of nanometers or tens of nanometers. The upper boron layer 108a may include a same or similar thickness as the lower boron layer 108b. For example, the deposition rate at which boron is deposited on the epitaxial layer 110 and the adhesion layer 106 may be the same or similar such that the upper boron layer 108a may include the same or similar thickness as the lower boron layer 108b. Thus, the thicknesses of the upper boron layer 108a and the lower boron layer 108b may be on the on the order of nanometers or tens of nanometers, and may be further understood with the examples and illustrations provided above in regards to the lower boron layer 108b.

The thickness of the lower boron layer 108b may vary between the minimum thickness and the maximum thickness along the width of the window 107. For example, the lower boron layer 108b may experience local loading effects. The local loading effects may be pattern dependent. The local loading effects may cause the thickness of the lower boron layer 108b to vary along the width of the window 107. For example, the local loading effects may cause the maximum thickness of the lower boron layer 108b to be at the interface between the lower boron layer 108b and the dielectric layer 104 and the minimum thickness of the lower boron layer 108b to be around the midpoint of the window 107. The impact of the local loading effects may increase as the size of the window 107 decreases.

The adhesion layer 106 and the upper boron layer 108a may reduce or eliminate the effect of local loading and/or improve the uniformity in thickness of the lower boron layer 108b along the width of the lower boron layer 108b. The adhesion layer 106 may reduce or eliminate the effect of local loading by deposing the boron in diborane gas on the adhesion layer 106 and reacting with the boron, thereby reducing and/or eliminating the lateral diffusion of the boron into the window 107. With the adhesion layer 106, the lower boron layer 108b is deposited much more homogeneously than without the adhesion layer 106. For example, the adhesion layer 106 and the upper boron layer 108a may enable the detector 100 to include the window 107 with a width on the order of several hundreds of micrometers, millimeters, tens of millimeters, or hundreds of millimeters while maintaining the thickness of the lower boron layer 108b within the minimum thickness tolerance and the maximum thickness tolerance along the width of the window 107. Thus, the adhesion layer 106 and the upper boron layer 108a may decorrelate the local loading effects to the width of the window 107.

The adhesion layer 106 and the upper boron layer 108a may be conductive and act as an electron shield for the dielectric layer 104. For example, the upper boron layer 108a may dope the adhesion layer 106 to be conductive. The dielectric layer 104 may negatively charge by trapping electrons in response to receiving the electrons. The adhesion layer 106 and/or the upper boron layer 108a may conduct the negative charge away from the dielectric layer 104. The adhesion layer 106 and the upper boron layer 108a may eliminate or greatly reduce the negative charging of the dielectric layer 104 due to electron bombardment or exposure by conducting the electrons away from the dielectric layer 104. Thus, the adhesion layer 106 and the upper boron layer 108a may act as the electron shield for the dielectric layer 104.

The anode 112 and cathode 114 may be coupled to the lower boron layer 108b and the silicon layer 102, respectively. The anode 112 and/or the cathode 114 may be deposited on a same side of the silicon layer 102 (not depicted). For example, the dielectric layer 104, the anode 112, and/or the cathode 114 may each be deposited on a same side of the silicon layer 102. The anode 112 and/or the cathode 114 may be deposited on the silicon layer 102 as interconnect pads (not depicted) or the like. The anode 112 and/or the cathode 114 may be a conductive metal. For example, the anode 112 and/or the cathode 114 may be aluminum, copper, or the like.

The lower boron layer 108b, the epitaxial layer 110, and the silicon layer 102 may form a p-n diode. For example, the p-n diode may be a (p+)(n−)(n+) diode where the epitaxial layer 110 is the (n−)-type semiconductor. The p-n diode may be the sensing element of the detector 100 by which the detector 100 is configured to detect the electrons 101 and/or the photons 103. A depletion region (not depicted) of the p-n diode may be disposed within the epitaxial layer 110. The electrons 101 and/or the photons 103 may penetrate through the lower boron layer 108b to the epitaxial layer 110 (e.g., to the depletion region). The epitaxial layer 110 may generate electron-hole pairs in response to absorbing the electrons 101 and/or the photons 103. The number of electron-hole pairs generated may be proportional to the energy of the electrons 101 and/or the photons 103. The electron-hole pairs may move from the epitaxial layer 110 by an electric field caused by the depletion region. The holes may move toward the anode 112 through the lower boron layer 108b and the electrons may move toward the cathode 114 through the silicon layer 102. The flow of electron-hole pairs may induce a current between the lower boron layer 108b and the silicon layer 102. The current may be collected and readout from the anode 112 and/or cathode 114 as a signal for detecting the electrons 101 and/or the photons 103. Thus, the detector 100 may be configured to detect the electrons 101 and/or the photons 103.

The capping layer 116 may be deposited on the lower boron layer 108b. The capping layer 116 may protect and/or prevent degradation of the lower boron layer 108b. The improved uniformity in thickness of the lower boron layer 108b may also improve a uniformity in thickness of the capping layer 116.

The capping layer 116 may also be deposited on the dielectric layer 104 and/or the upper boron layer 108a (not depicted). For example, the capping layer 116 may be conformal to the dielectric layer 104, the upper boron layer 108a, and/or the window 107.

The capping layer 116 may be compatible with detecting the electrons 101 and/or the photons 103. The electrons 101 and/or the photons 103 may penetrate through the capping layer 116. Where the detector 100 is configured to detect the electrons 101, the capping layer 116 may be a metal, such as aluminum oxide, ruthenium, tungsten, or molybdenum. The metal may also be a spectral filter to allow the penetration of the electrons 101 while preventing the penetration of the photons 103. Where the detector 100 is configured to detect the photons 103, the capping layer 116 may be an anti-reflective (AR) coating. The anti-reflection coating may be a VUV anti-reflection coating. The anti-reflection coating may include one or more materials, such as silicon dioxide, silicon nitride, aluminum oxide, magnesium fluoride, lithium fluoride, hafnium dioxide, or the like.

Figure 2:
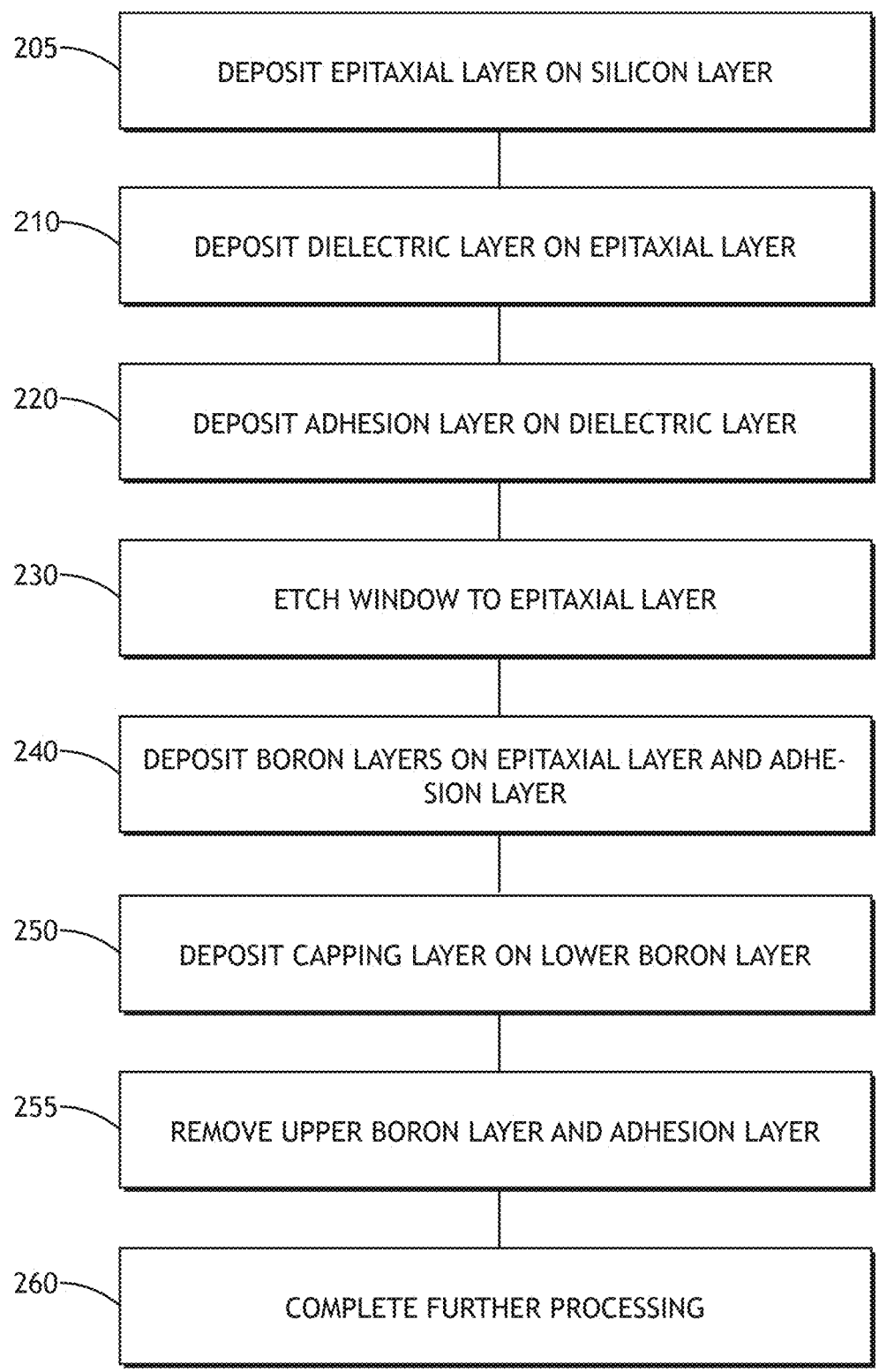
FIG. 2 depicts a flow diagram of a method of manufacturing the detector, in accordance with one or more embodiments of the present disclosure.
Figure 3A:
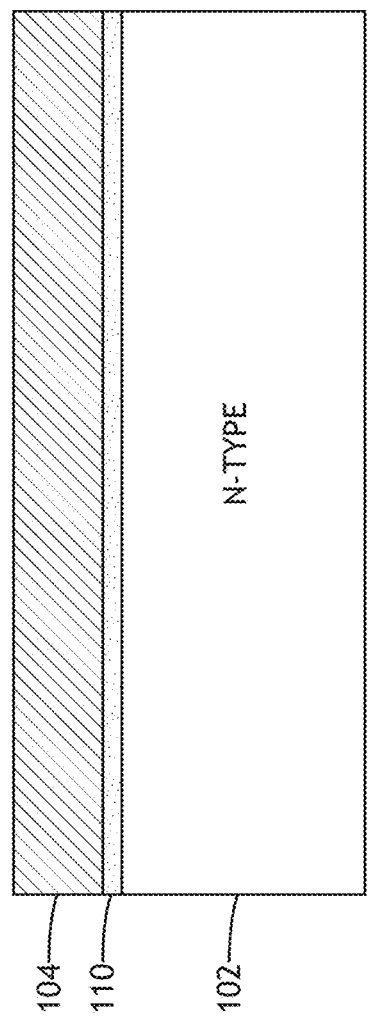
FIG. 3A depicts depositing a dielectric layer on an epitaxial layer, in accordance with one or more embodiments of the present disclosure.
Figure 3B:
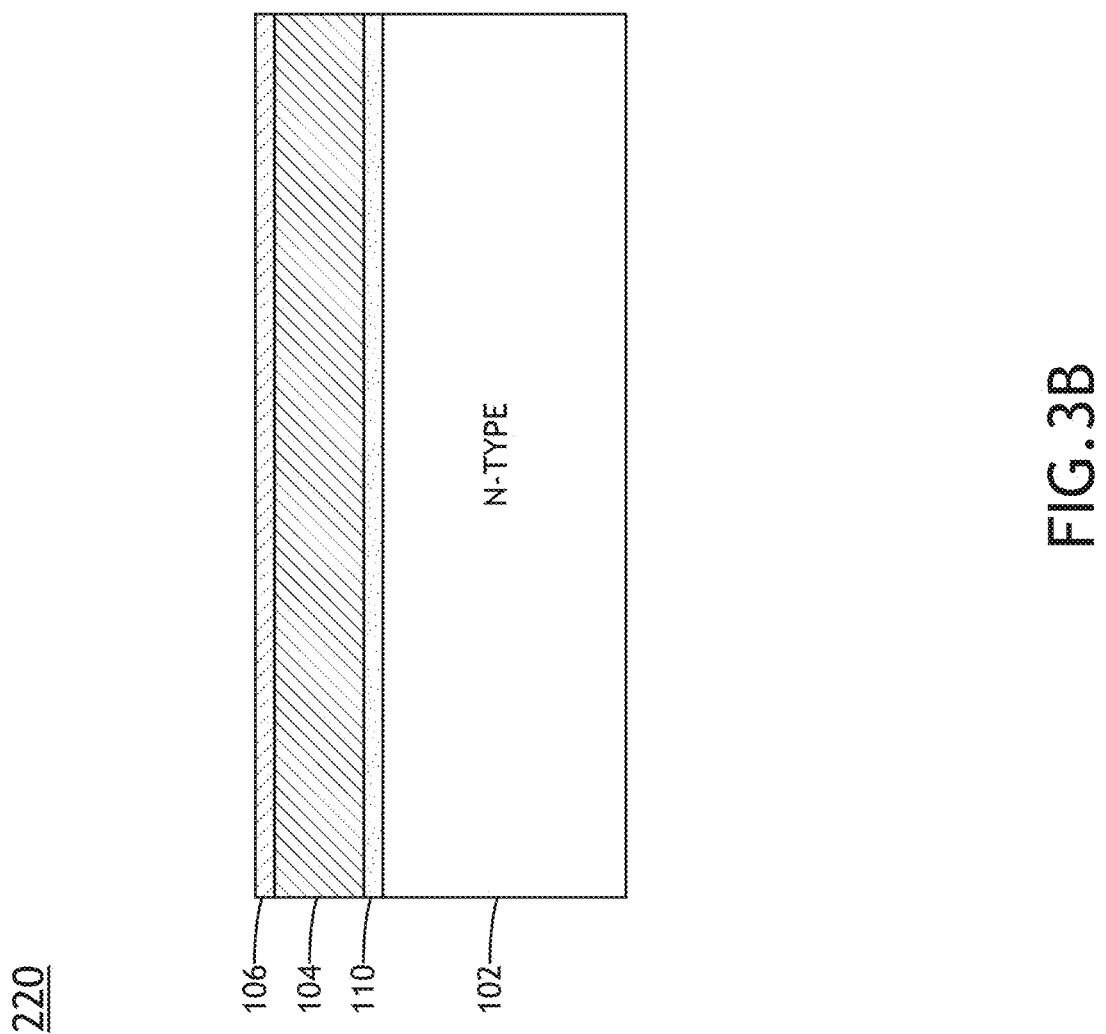
FIG. 3B depicts depositing an adhesion layer on the dielectric layer, in accordance with one or more embodiments of the present disclosure.
Figure 3C:
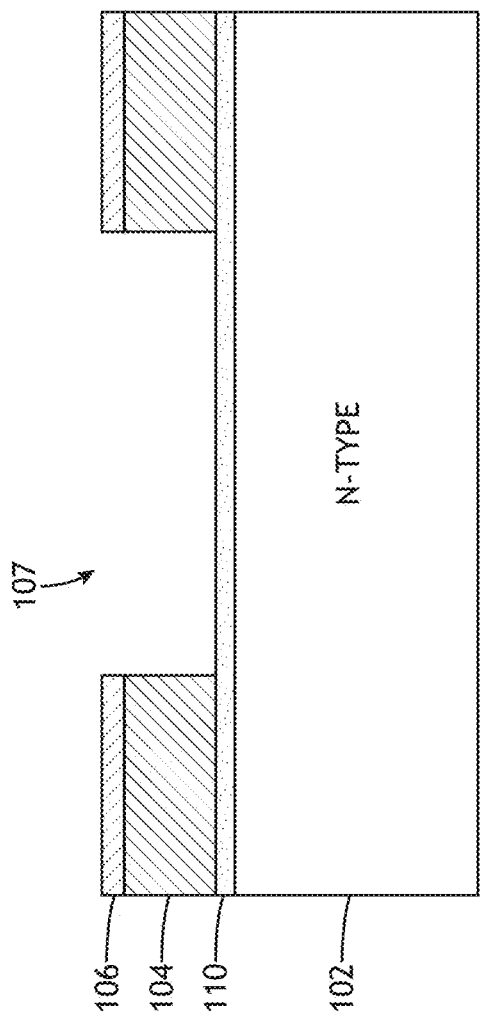
FIG. 3C depicts etching a window through the adhesion layer and the dielectric layer to the epitaxial layer, in accordance with one or more embodiments of the present disclosure.
Figure 3D:
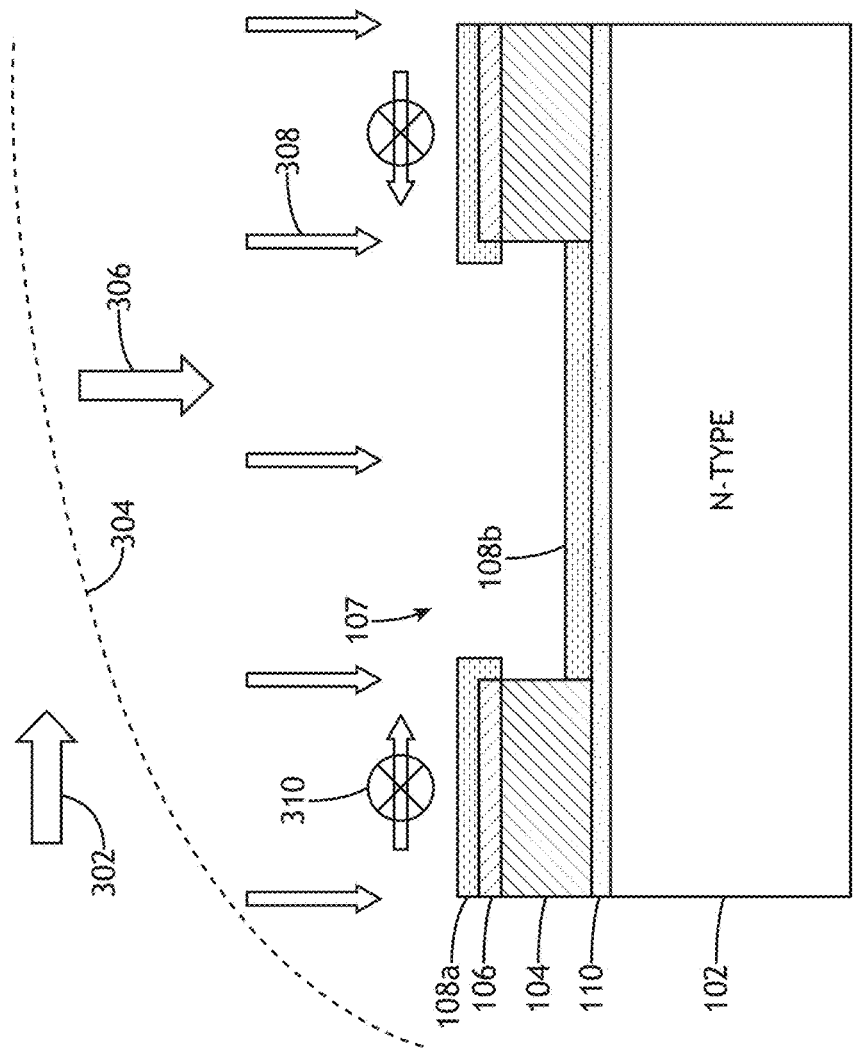
FIG. 3D depicts depositing boron layers on the epitaxial layer within the window and on the adhesion layer, in accordance with one or more embodiments of the present disclosure.
Figure 3E:
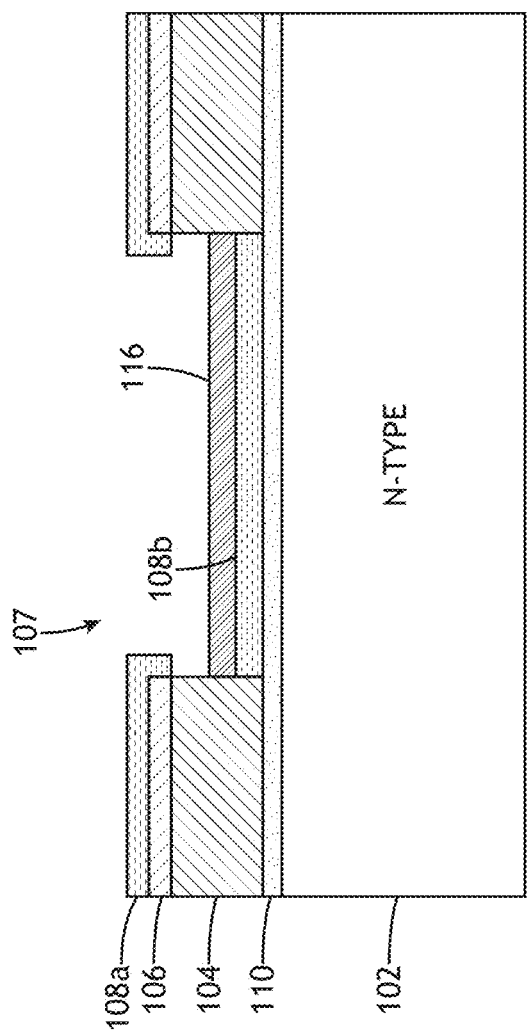
FIG. 3E depicts depositing a capping layer, in accordance with one or more embodiments of the present disclosure.
Figure 3F:
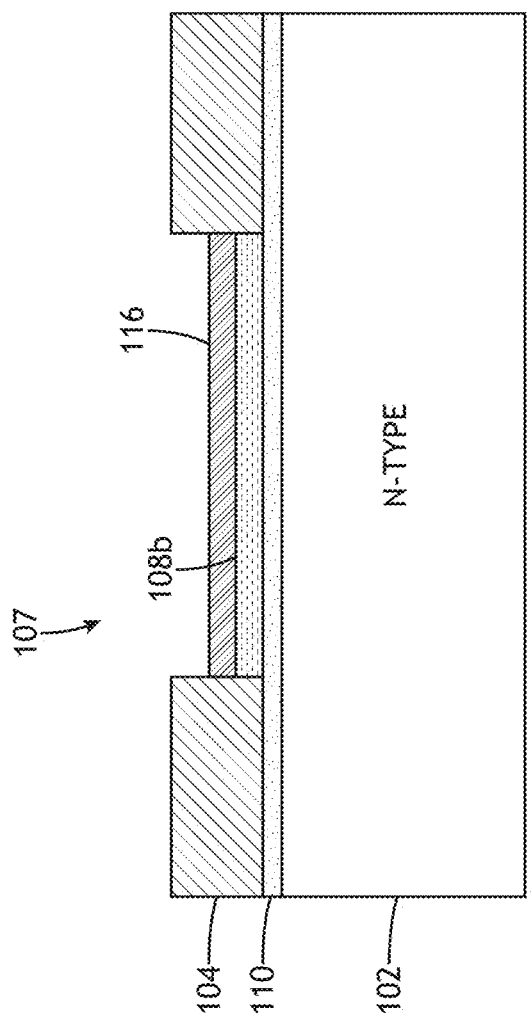
FIG. 3F depicts removing the upper boron layer and the adhesion layer, in accordance with one or more embodiments of the present disclosure.
Figure 3G:
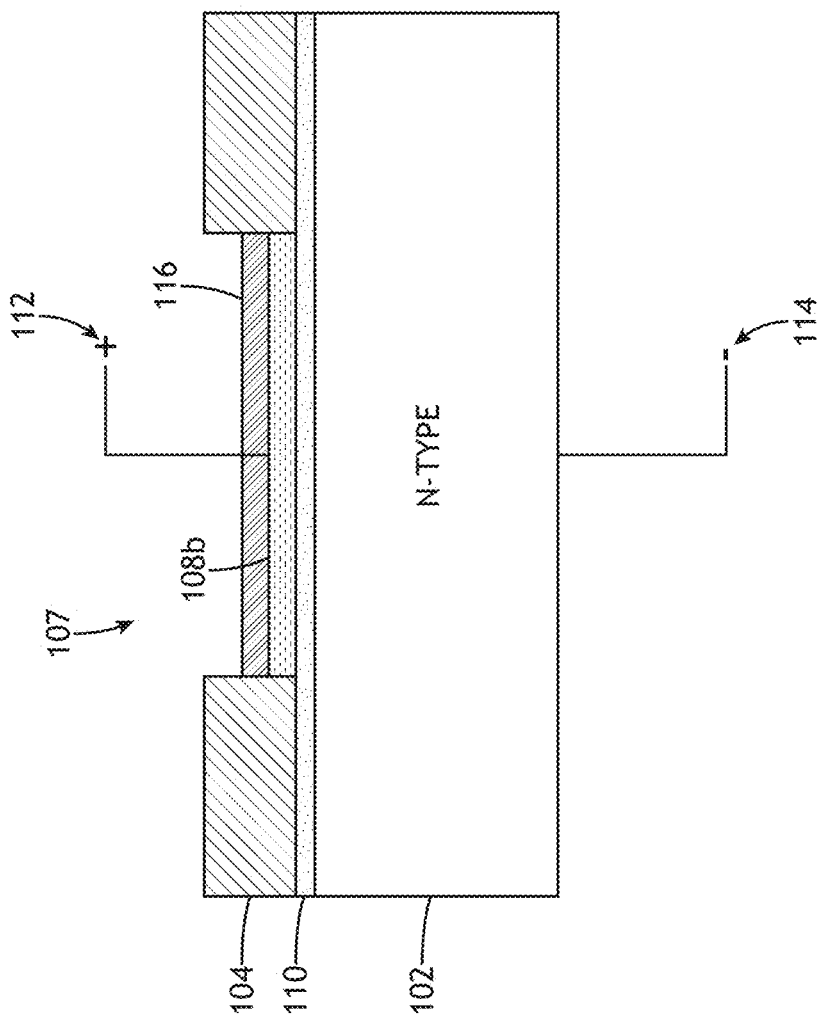
FIG. 3G depicts the detector after a cathode and anode are formed by further processing, in accordance with one or more embodiments of the present disclosure.

FIG. 2 depicts a flow diagram of a method 200, in accordance with one or more embodiments of the present disclosure. The method 200 is a method of forming the detector 100. The embodiments and enabling technologies described previously herein in the context of the detector 100 should be interpreted to extend to method 200. It is further noted, however, that the method is not limited to the architecture of the detector 100. The steps of the method 200 may be further understood with reference to FIGS. 3A-3G.

In a step 205, an epitaxial layer may be deposited on a silicon layer. For example, the epitaxial layer 110 may be deposited on the silicon layer 102. The epitaxial layer 110 may be deposited using any suitable technique.

In a step 210, a dielectric layer may be deposited on the epitaxial layer. For example, the dielectric layer 104 may be deposited on the epitaxial layer 110. The dielectric layer 104 may be deposited using any suitable technique. For example, the dielectric layer 104 may be silicon oxide which may be deposited by thermal growth at a temperature, such as approximately 900 to 1000° C. The silicon oxide may be stable when grown to a thickness of about 1.5 nm to 2 nm. By way of another example, the dielectric layer 104 may be silicon nitride which may be deposited using plasma-enhanced chemical-vapor deposition (CVD).

In a step 220, an adhesion layer may be deposited on the dielectric layer. For example, the adhesion layer 106 may be deposited on the dielectric layer 104. The dielectric layer 104 may be deposited using any suitable technique. For example, the dielectric layer 104 may be polycrystalline silicon which may be deposited by chemical vapor deposition.

The deposition of the adhesion layer 106 on the dielectric layer 104, the deposition of the dielectric layer 104 on the epitaxial layer 110, and/or the deposition of the epitaxial layer 110 on the silicon layer 102 may be blanket-type depositions where the adhesion layer 106, the dielectric layer 104, and/or the epitaxial layer 110 cover the width of the silicon layer 102, without any pre-patterning.

In a step 230, a window may be etched through the adhesion layer and the dielectric layer to the epitaxial layer. For example, the window 107 may be etched through the adhesion layer 106 and the dielectric layer 104 to the epitaxial layer 110. Both the adhesion layer 106 and the dielectric layer 104 may be patterned by a same mask.

The window 107 may be etched using any suitable technique. For example, the window 107 may be etched by wet etching or dry etching. The etching can be performed by wet etching methods using alkaline solutions such as potassium hydroxide (KOH), tetramethylammonium hydroxide (TMAH), or the like. The adhesion layer 106 may be first etched with the dielectric layer 104 acting as a natural etch stop. The dielectric layer 104 may then be removed using hydrofluoric acid and/or buffered oxide etch with the epitaxial layer 110 acting as a natural etch stop. Alternatively, the adhesion layer 106 and the dielectric layer 104 may be removed using dry etching methods such as reactive ion etching (RIE) and/or inductively coupled plasma reactive ion etching (ICPRIE).

In a step 240, boron layers may be deposited on the epitaxial layer and the adhesion layer. For example, the upper boron layer 108a may be deposited on the adhesion layer 106 and the lower boron layer 108b may be deposited on the epitaxial layer 110. The epitaxial layer 110 may include an oxide-free surface on which the lower boron layer 108b is deposited.

The boron layers 108 may be deposited using any suitable technique. For example, the boron layers 108 may be deposited using diborane ($B_2H_6$) in an atmospheric-/reduced-pressure chemical vapor deposition (AP/RPCVD) reactor. A main stream gas 302 may flow over the detector 100. The main stream gas 302 may include a gas source and a carrier gas. Diborane and hydrogen may be used as the gas source and the carrier gas, respectively. The main stream gas 302 may be a mixture of diborane and hydrogen gases at a temperature to create the high-purity amorphous boron layers. The temperature may be higher than 500° C. For example, the temperature may be between 60° and 900° C. For instance, the temperature may be between 70° and 800° C. The boron layers 108 may also be deposited at lower temperatures, although the thickness may be less uniform. A boundary layer 304 of the carrier gas (e.g., the hydrogen gas) may be formed between the main stream gas 302 and the detector 100. Diborane species 306 may decompose from the diborane gas and may diffuse through the boundary layer 304. The diborane species 306 may vertically diffuse 308 and be deposited as the upper boron layers 108a on the adhesion layer 106 and as the lower boron layers 108b on the epitaxial layer 110. The adhesion layer 106 and the epitaxial layer 110 may react with the diborane species 306 to deposit the upper boron layer 108a and the lower boron layer 108b, respectively. The dielectric layer 104 may not react with the diborane species 306, such that boron layers 108 are not deposited on the dielectric layer 104.

The diborane species 306 may or may not laterally diffuse 310 along the adhesion layer 106 into the window 107. The adhesion layer 106 may suppress the lateral diffusion. For example, the deposition of the upper boron layers 108a on the adhesion layer 106 may prevent the lateral diffusion into the window 107. By eliminating the lateral diffusion, there is no excessive radicals around the edge of the window 107. The uniformity in thickness of the lower boron layer 108b may then be achieved for any size of the window 107.

In an optional step 250, a capping layer may be deposited on the lower boron layer. For example, the capping layer 116 may be deposited on the lower boron layer 108b. The capping layer 116 may also be deposited on the upper boron layer 108a and/or the sides of the window 107. The capping layer 116 may be deposited using any suitable technique. For example, the capping layer 116 may be deposited using atomic layer deposition (ALD). The atomic layer deposition may enable deposition of the capping layer 116 with very precise (e.g., single monolayer) control of the thickness.

In an optional step 255, the upper boron layer and the adhesion layer may be removed. For example, the upper boron layer 108a and the adhesion layer 106 may be removed. The upper boron layer 108a and the adhesion layer 106 may be removed using any suitable technique. For example, the upper boron layer 108a and the adhesion layer 106 may be removed by polishing and/or etching. With the lower boron layer 108b being protected by resist or other masking material, the upper boron layer 108a and the adhesion layer 106 may be removed using chlorine-containing chemistry by reactive-ion etching (RIE), or the like. The upper boron layer 108a and the adhesion layer 106 may be etched using etching chemistries with selectivity to polysilicon-over-oxide. For instance, the window 107 may be dry etched using chlorine trifluoride gas or the like.

The upper boron layer 108a and the adhesion layer 106 may be removed to expose the dielectric layer 104. Exposing the dielectric layer 104 by removing the upper boron layer 108a and the adhesion layer 106 may ensure the compatibility of the detector 100 with one or more further processing steps. It is further contemplated that the detector 100 may be compatible with the further processing steps without removing the upper boron layer 108a and the adhesion layer 106.

In a step 260, further processing may be performed to complete the detector 100. Additional steps may be performed on the front side that finish the detector 100. The further processing steps may include forming interconnects (e.g., including the anode 112 and the cathode 114). The interconnects may be formed by Al, Cu, or another metal. The interconnects may also be covered by a passivation layer to protect the interconnects. The subsequent processing steps may include packaging the detector 100. The package may include flip-chip bonding or wire bonding of a chip to a substrate. The package may include a window that transmits wavelengths of interest, or may comprise a flange or seal for interface to a vacuum seal. In electron-bombarded image sensor embodiments, the package may include other components such as a photocathode as well as a sealed, evacuated tube. The resulting structure may be packed in a suitable package. The packing step may comprise flip-chip bonding or wire bonding of the device to the substrate. The package may include a window that transmits wavelengths of interest, or may include a flange or seal for interface to a vacuum seal.

Figure 4A:
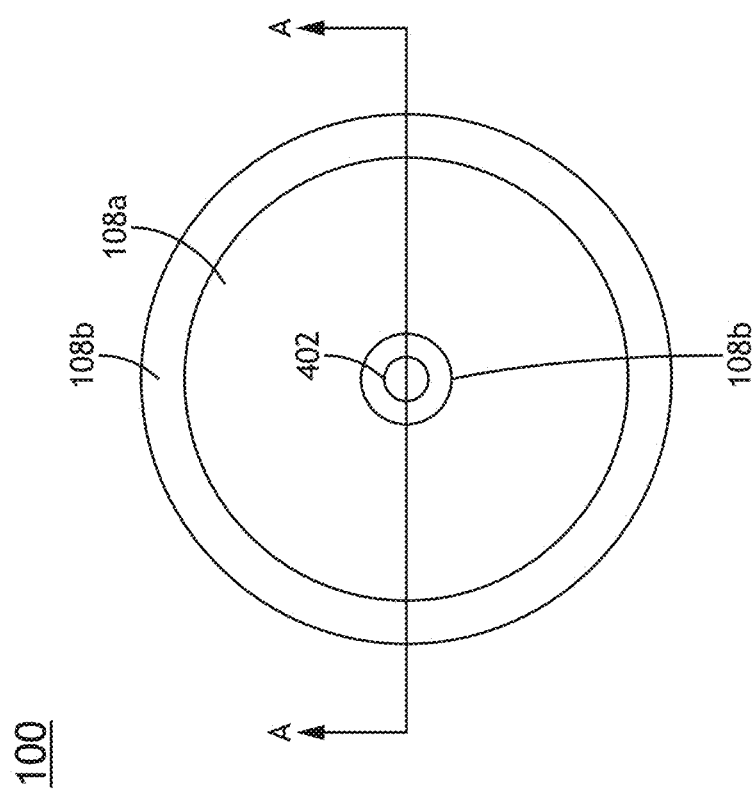
FIG. 4A depicts a top view of the detector, in accordance with one or more embodiments of the present disclosure.
Figure 4B:
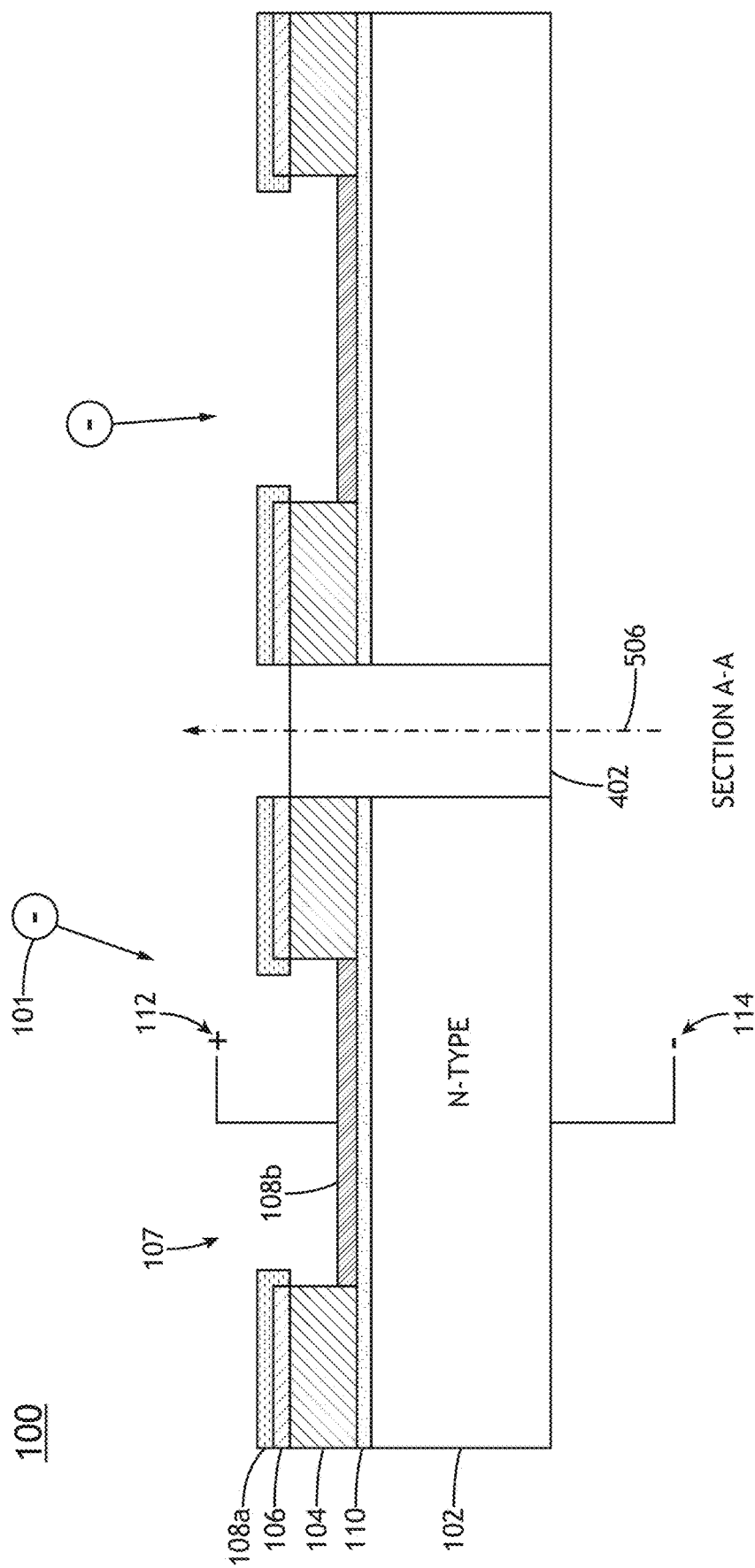
FIG. 4B depicts a cross-section view of the detector, in accordance with one or more embodiments of the present disclosure.
Figure 4C:
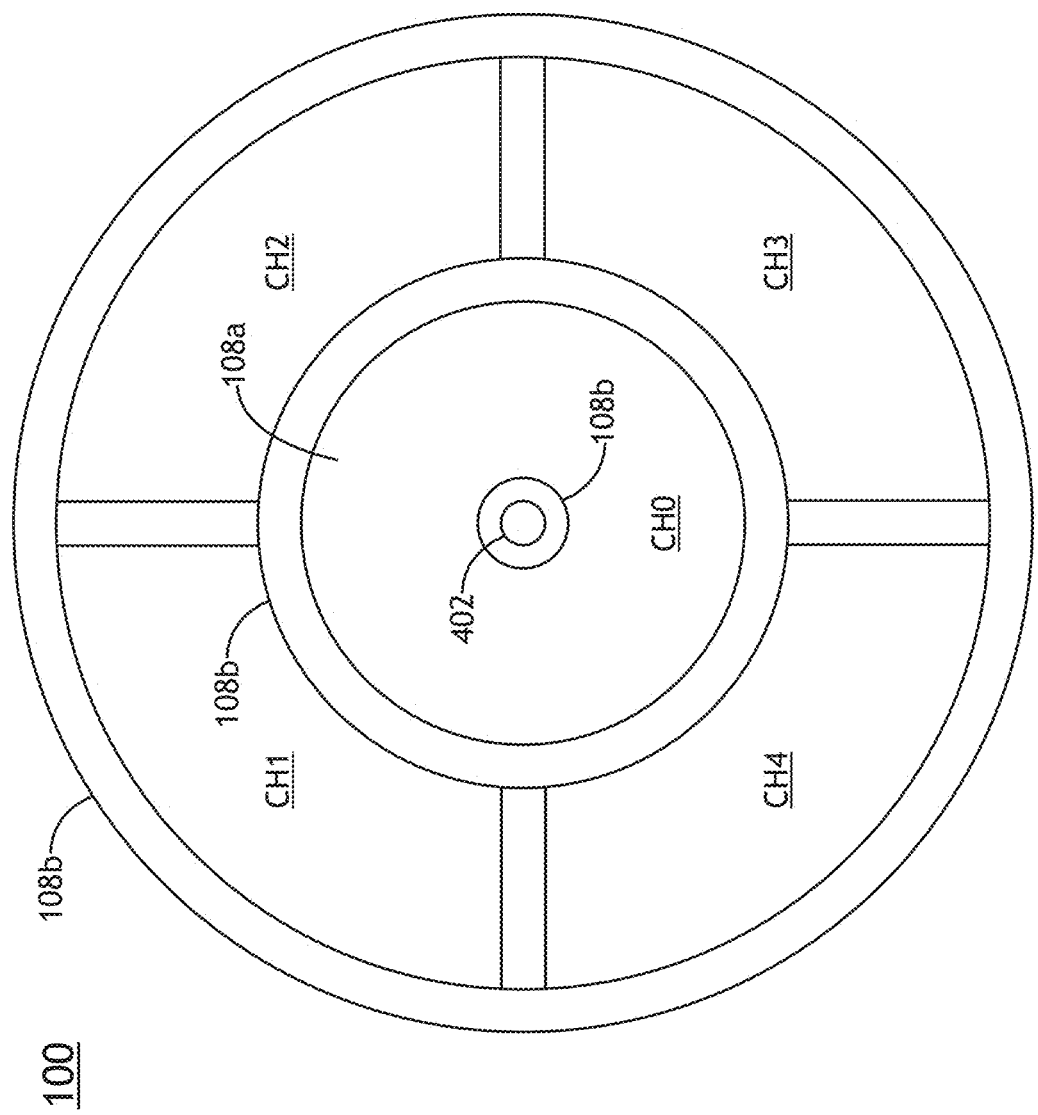
FIG. 4C depicts a top view of the detector configured with multiple channels, in accordance with one or more embodiments of the present disclosure.

FIGS. 4A-4C depicts the detector 100, in accordance with one or more embodiments of the present disclosure. The detector 100 may be configured to detect secondary electrons (SE) and/or backscatter electrons (BSE).

The detector 100 may be annular. The silicon layer 102, the dielectric layer 104, the adhesion layer 106, and/or the upper boron layer 108a may define the annular shape with the lower boron layer 108b disposed radially therebetween.

The detector 100 may define an aperture 402. The aperture 402 may be concentric to the annular shape. The aperture 402 may be defined through the detector 100. For example, the aperture 402 may be defined through the silicon layer 102, the dielectric layer 104, the adhesion layer 106, the upper boron layer 108a, and/or the epitaxial layer 110. The aperture 402 may permit an electron beam (e.g., electron beam 506) to pass through the detector 100. The lower boron layer 108b may be concentric too and surround the aperture 402 for receiving the electrons 101 in response to the electron beam. The detector 100 may be designed for backside illumination, meaning the electron beam may pass through the aperture 402, hit a sample (e.g., sample 528), and cause secondary electrons and/or backscattered electrons to reflect toward the detector 100 and hit the lower boron layer 108b.

The detector 100 may also be segmented into multiple channels. The channels may be configured to independently detect the electrons 101 and/or the photons 103. The channels may provide increased spatial resolution when detecting the electrons 101. The multiple channels may also allow the detector 100 to simultaneously detect secondary electrons and backscattered electrons. Each of the channels may be configured to have equal area for equal capacitance. The equal capacitance may allow the channels to have equal or very similar responses as the other channels to optimize the electronic readout. The channels may each include the lower boron layer 108b and the epitaxial layer 110 which are segmented by the dielectric layer 104, the adhesion layer 106, and the upper boron layer 108a. The detector 100 may include any number of the channels. For example, FIG. 4C depicts the detector 100 segmented into five channels. The channels may include a center channel (CH0) surround by four quadrants of channels (CH1, CH2, CH3, CH4). The aperture 402 may be through a center of the center channel (CH0).

Figure 5:
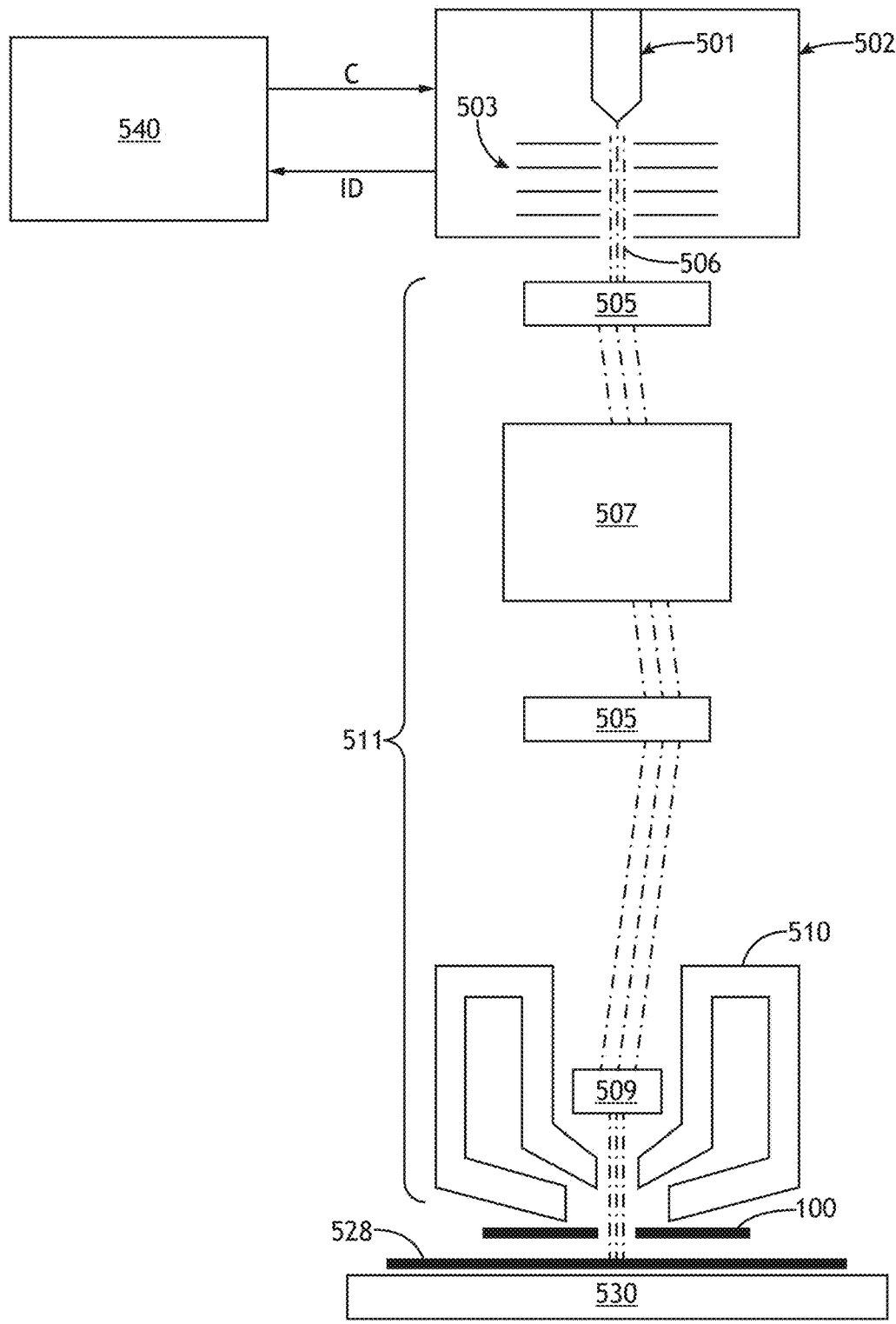
FIG. 5 depicts a simplified block diagram of a scanning electron microscope, in accordance with one or more embodiments of the present disclosure.

FIG. 5 depicts a scanning electron microscope 500 (SEM), in accordance with one or more embodiments of the present disclosure. The scanning electron microscope 500 may be an inspection or review system configured to inspect or review a sample 528. The scanning electron microscope 500 may review and/or inspect the sample 528 for defects and to reveal the material composition of the sample 528 and/or defects. The scanning electron microscope 500 may include an electron source 502, an electron optical system 511, a stage 530, and/or a controller 540.

The electron source 502 may be a source of electrons. The electron source 502 may include any electron source suitable for generating an electron beam 506. The electron source 502 may also be referred to as an electron gun. The electron beam 506 may also be referred to as a primary electron beam. The electron beam 506 may include a beam energy and a beam current.

The electron source 502 may include electron emitters 501, extractors 503, a magnetic lens (not depicted), and the like. The electron source 502 may include any number of the electron emitters 501. For example, the electron source 502 may include a single of the electron emitters 501. By way of another example, the electron source 502 may include multiple of the electron emitters 501. The electron emitters 501 may be a cathode. For example, the cathode may include a thermal field-emitting a Schottky cathode, a cold-field emitter, a single-crystal tungsten cathode, a LaB6 cathode, or the like. The extractors 503 may be electrodes. The extractors 503 may be arranged in the path of the electron beam 506.

The electron optical system 511 may include a set of electron optics arranged in an electron-optical column. The electron optical system 511 may include one or more focusing optics and/or deflecting optics. The focusing optics may focus the electron beam 506 onto the sample 528. The electron optical system 511 may include any focusing optics. For example, the one or more focusing optics may include, but are not limited to, condenser lens 507 and objective lens 510.

The condenser lens 507 may de-magnify the electron beam 506 to create a small spot on the sample 528. Spot sizes of about one or a few nm may generate high-resolution images for review of the sample 528. Inspection of the sample 528 may use larger spot sizes to scan the sample 528 more quickly. The electron optical system 511 may include any number of the condenser lens 507. A single of the condenser lens 507 may suffice when the spot size is of order of one-hundred nanometers or larger, but two or more of the condenser lens 507 may be needed for spot sizes of tens of nm or smaller. The condenser lens 507 may include a magnetic lens, an electrostatic lens, both a magnetic lens and an electrostatic lens, or the like.

The objective lens 510 may be a final lens within the electron optical system 511 before the electron beam 506 reaches the sample 528. The objective lens 510 may focus the electron beam 506 to a small spot on the sample 528. The objective lens 510 may include a magnetic lens, an electrostatic lens, a combination of a magnetic lens and an electrostatic lens, or the like. The objective lens 510 may be an immersion lens. To achieve a small spot size at the sample 528, the objective lens 510 may be placed close to the sample 528, so that the sample 528 is immersed in the magnetic field of the objective lens 510. Immersing the sample in the magnetic field may reduce aberrations in the electron spot on the sample 528.

The deflection optics may be configured to scan the electron beam 506 over the sample 528. The electron optical system 511 may include any deflection optics. The one or more deflection optics may include, but are not limited to, one or more deflectors (e.g., scanning coils). For example, the electron optical system 511 may include deflectors 505 and deflectors 509. The deflectors 505 may scan the electron beam 506 over an area of the sample 528. The deflectors 505 may be placed on either side of condenser lens 507 as shown, or within the condenser lens 507 (not shown), or after the condenser lens 507. The deflectors 505 may include electrostatic deflectors or a combination of magnetic and electrostatic deflectors. The deflectors 509 may work in combination with deflectors 505 to scan the electron beam 506 over an area of the sample 528.

The electron beam 506 may be focused and deflected by the deflectors 505, the condenser lens 507, the deflectors 509, and the objective lens 510 onto the sample 528 positioned on the stage 530. The electron source 502 and electron optical system 511 may be arranged in a single-beam configuration or in a multi-beam configuration. For example, the electron source 502 may generate a single of the electron beam 506 that is deflected and focused onto the sample 528. By way of another example, the electron source 502 may also generate multiple of the electron beams 506 that are deflected and focused onto the sample 528. As depicted, the electron source 502 and electron optical system 511 are depicted in the single-beam configuration, although this is not intended to be limiting.

The sample 528 may include sample types typically reviewed by the scanning electron microscope 500. For example, the sample 528 may include an un-patterned semiconductor wafer, a patterned semiconductor wafer, a reticle, a photomask, or the like.

The stage 530 may support and position the sample 528. The sample 528 may be placed on the stage 530. The stage 530 may facilitate movement of different regions of sample 528 underneath the electron optical system 511. The stage 530 may include an X-Y stage or an R-θ stage. The stage 530 may adjust the height of sample 528 during inspection to maintain focus.

The electron optical system 511 may also include a focus sensor (not shown). The focus sensor may be an optical sensor. The focus sensor may also be referred to as a height sensor. The focus sensor may be mounted on or proximate to objective lens 510. The focus sensor may provide a signal to adjust the height of sample 528 or to adjust the focus of the objective lens 510.

The electrons 101 may be emitted from an area of the sample 528 when the electron beam 506 is scanned by the electron optical system 511 over the area. The electrons 101 may emanate from the sample 528 in response to the electron beam 506. The electrons 101 may be secondary and/or backscattered electrons. Secondary electrons and back-scattered electrons may be emitted from an area of the sample 528 when the electron beam 506 is scanned by the electron optics across the area.

The detector 100 may not block the electron beam 506 on the way to the sample 528. The detector 100 may be positioned at one or more selected locations in view of the sample 528. The detector 100 may be configured to collect the electrons 101 emanated from the sample 528 in response to the electron beam 506. The electrons 101 may be detected by the detector 100 that is in direct line-of sight to the region of the sample 528 being exposed to the electron beam 506. The detector 100 may be adjacent to the sample 528. For example, the detector 100 may be placed between the objective lens 510 and the sample 528. The gap between the sample 528 and the objective lens 510 may be small, such as about 2 mm or less, and clearance may be needed, for example, for a focus or height sensor, and so it may not be practical to place the detector 100 between the objective lens 510 and the sample 528.

The scanning electron microscope 500 may include any number of the detectors 100. The detectors 100 may also be multi-column electron detectors. For example, the scanning electron microscope 500 may include multiple electron beam columns with the multi-column electron detectors. The multiple electron beam columns may enable parallel inspection of the sample 528.

The detector 100 may include an application specific integrated circuit. The application specific integrated circuit may be used to digitize and preprocess the signals collected by the detector 100. The detector 100 may be configured to generate image data signal ID in response to detecting the electrons 101. The image data signal ID may be transferred to controller 540 from the detector 100. The controller 540 may utilize the detector 100 to generate images of the scanned area of the sample 528. For example, the controller 540 may utilize the X-ray image data signal ID to generate an image of the associated scanned sample area, whereby visual inspection of a defect including an unknown material is facilitated.

The controller 540 may also be configured to perform additional functions, such as determining the presence of a defect and/or the type of the defect based on the image data signals ID. For example, the controller 540 may use the image data signals ID to determine the presence of the defect in the scanned area. The defect may include the presence of material (such as a particle) that is not supposed to be present in the scanned area, the absence of material that is supposed to be in the scanned area (such as may happen with an over-etched condition), or a malformed pattern. The controller 540 may also determine the defect type and/or material type of the defect.

FIG. 6 depicts a detector array 600, in accordance with one or more embodiments of the present disclosure. The detector array 600 may include an array of the detectors 100. The detectors 100 may be arranged in a two-dimensional array with a select lattice configuration. For example, the detectors 100 may be arranged in a hexagonal lattice (as depicted), a square lattice, or the like. The detectors 100 may be arranged with a select pitch between adjacent of the detectors 100. For example, the pitch between the detectors 100 may be on the order of micrometers, tens of micrometers, or hundreds of micrometers (e.g., between 1 and 999 micrometers). The silicon layer 102 and/or the epitaxial layer 110 may be monolithic across the detector array 600. In this regard, the silicon layer 102 and/or the epitaxial layer 110 may be a single piece which is not formed of constituent pieces which are patterned. The silicon layer 102 may be a wafer or reticle. The dielectric layer 104, the adhesion layer 106, and/or the boron layers 108 may be patterned across the detector array 600 to define the array of the detectors 100.

The detectors 100 in the detector array 600 may be configured to detect secondary electrons (SE) and/or backscatter electrons (BSE) and/or may be segmented into the channels.

The detectors 100 in the detector array 600 may be formed by etching the windows 107 for each of the detectors 100 when etching the windows 107 to the epitaxial layer 110.

The scanning electron microscope 500 may include the detector array 600, where each of the detectors 100 may be configured to generate the image data signal ID in response to detecting the electrons 101. The array of the detectors 100 may be advantageous to achieve low crosstalk between different beam channels of the scanning electron microscope 500. Reducing the crosstalk may be beneficial to decrease a signal-to-noise ratio (SNR) of the scanning electron microscope 500.

Referring generally again to the figures.

Although the epitaxial layer 110 is described as an n-type semiconductor and the p-n diode is described as a being a (p+)(n−)(n+) diode, this is not intended as a limitation of the present disclosure. It is contemplated that the benefits of the adhesion layer 106 may apply to various types of p-n diodes. For example, the epitaxial layer 110 may be an intrinsic layer and the p-n diode may be a PIN diode. By way of another example, the epitaxial layer 110 may be an lightly-doped p-type layer (e.g., a (p−)-type semiconductor) and the p-n diode may be a (p+)(p−)(n+) diode, where the doping concentration of the lightly-doped p-type layer is less than the lower boron layer 108b. The intrinsic layer and/or the lightly-doped p-type layer may be grown by forming a thin-boron doped layer at low temperatures (e.g., less than or equal to 450° C.) before depositing the boron layers 108.

It is further contemplated that each of the embodiments of the method described above may include any other step(s) of any other method(s) described herein. In addition, each of the embodiments of the method described above may be performed by any of the systems described herein.

In embodiments, a controller may include one or more controllers housed in a common housing or within multiple housings. In this way, any controller or combination of controllers may be separately packaged as a module suitable for integration into a system. Further, the controllers may analyze data received from detectors and feed the data to additional components within the system or external to the system. The controller may also include one or more processors and/or a memory medium.

The one or more processors may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors may include any device configured to execute algorithms and/or instructions (e.g., program instructions stored in memory). In one embodiment, the one or more processors may be embodied as a desktop computer, mainframe computer system, workstation, image computer, parallel processor, networked computer, or any other computer system configured to execute a program. Moreover, different subsystems of the system may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers.

The memory medium may include any storage medium known in the art suitable for storing program instructions executable by the associated one or more processors. For example, the memory medium may include a non-transitory memory medium. By way of another example, the memory medium may include, but is not limited to, a read-only memory (ROM), a random-access memory (RAM), a magnetic or optical memory device (e.g., disk), a magnetic tape, a solid-state drive and the like. The memory medium may include flash memory cells, or other type memory, discrete EPROM or EEPROM, or the like. It is further noted that memory medium may be housed in a common controller housing with the one or more processors. In one embodiment, the memory medium may be located remotely with respect to the physical location of the one or more processors and controller. For instance, the one or more processors of controller may access a remote memory (e.g., server), accessible through a network (e.g., internet, intranet and the like).

As used throughout the present disclosure, the term "substrate" generally refers to a substrate formed of a semiconductor or non-semiconductor material (e.g., thin filmed glass, or the like). For example, a semiconductor or non-semiconductor material may include, but is not limited to, monocrystalline silicon, gallium arsenide, indium phosphide, or a glass material. A substrate may include one or more layers. For example, such layers may include, but are not limited to, a resist (including a photoresist), a dielectric material, a conductive material, and a semiconductive material. Many different types of such layers are known in the art, and the term sample as used herein is intended to encompass a substrate on which all types of such layers may be formed. One or more layers formed on a substrate may be patterned or un-patterned. For example, a substrate may include a plurality of dies, each having repeatable patterned features. Formation and processing of such layers of material may ultimately result in completed devices. Many different types of devices may be formed on a substrate, and the term substrate as used herein is intended to encompass a substrate on which any type of device known in the art is being fabricated. Further, for the purposes of the present disclosure, the term substrate and wafer should be interpreted as interchangeable. In addition, for the purposes of the present disclosure, the terms patterning device, mask, and reticle should be interpreted as interchangeable.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mixable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A detector comprising:
   a silicon layer, wherein the silicon layer is monocrystalline silicon and an n-type semiconductor;
   an epitaxial layer, wherein the epitaxial layer is deposited on the silicon layer;
   a dielectric layer, wherein the dielectric layer is deposited on the epitaxial layer;
   an adhesion layer, wherein the adhesion layer is deposited on the dielectric layer, wherein the dielectric layer and the adhesion layer define a window to the epitaxial layer; and
   boron layers including an upper boron layer and a lower boron layer, wherein the upper boron layer is deposited on the adhesion layer, wherein the lower boron layer is deposited on the epitaxial layer within the window, wherein the boron layers are p-type semiconductors, wherein the upper boron layer is separated from the lower boron layer by the dielectric layer, wherein the lower boron layer includes a boron concentration of at least 80 percent, wherein the lower boron layer is a pinhole-free film, wherein at least one of an electron or a photon is configured to penetrate the lower boron layer, wherein the lower boron layer, the epitaxial layer, and the silicon layer form a p-n diode by which the detector is configured to detect at least one of the electron or the photon.

2. The detector of claim 1, wherein the dielectric layer is a silicon-based dielectric.

3. The detector of claim 2, wherein the dielectric layer is one of silicon oxide or silicon nitride.

4. The detector of claim 1, wherein the adhesion layer is a silicon-based Group IV material.

5. The detector of claim 4, wherein the adhesion layer is polycrystalline silicon.

6. The detector of claim 1, wherein a thickness of the adhesion layer is on an order of hundreds of nanometers or micrometers.

7. The detector of claim 6, wherein the thickness of the adhesion layer is on the order of hundreds of nanometers.

8. The detector of claim 1, wherein a width of the window is on an order of hundreds of micrometers, millimeters, tens of millimeters, or hundreds of millimeters.

9. The detector of claim 8, wherein the width of the window is on the order of hundreds of micrometers, millimeters, or tens of millimeters.

10. The detector of claim 9, wherein the width of the window is on the order of hundreds of micrometers or millimeters.

11. The detector of claim 1, wherein the boron concentration is at least 95 percent.

12. The detector of claim 11, wherein the boron concentration is at least 99 percent.

13. The detector of claim 1, wherein thicknesses of the upper boron layer and the lower boron layer are on an order of nanometers or tens of nanometers.

14. The detector of claim 13, wherein the thicknesses of the upper boron layer and the lower boron layer are between 2 nm and 20 nm.

15. The detector of claim 14, wherein the thicknesses of the upper boron layer and the lower boron layer are between 2 nm and 10 nm.

16. The detector of claim 1, further comprising an anode and a cathode, wherein the anode is coupled to the lower boron layer, wherein the cathode is coupled to the silicon layer.

17. The detector of claim 1, further comprising a capping layer, wherein the capping layer is deposited on the lower boron layer.

18. The detector of claim 17, wherein the capping layer is an anti-reflective coating.

19. The detector of claim 1, wherein the detector is annular, wherein the detector defines an aperture through the silicon layer, the dielectric layer, the adhesion layer, the upper boron layer, and the epitaxial layer.

20. The detector of claim 19, wherein the detector is segmented into a plurality of channels configured to independently detect at least one of the electron or the photon.

21. The detector of claim 1, wherein the detector is one of a plurality of detectors of a detector array, wherein the silicon layer and the epitaxial layer are monolithic across the detector array.

22. The detector of claim 1, wherein the epitaxial layer is an n-type semiconductor which is lightly doped, wherein the silicon layer is heavily doped, wherein the p-n diode is a (p+)(n−)(n+) diode.

23. The detector of claim 1, wherein the adhesion layer and the upper boron layer are conductive and act as an electron shield for the dielectric layer.

24. A method comprising:
    depositing an epitaxial layer on a silicon layer, wherein the silicon layer is monocrystalline silicon and an n-type semiconductor;
    depositing a dielectric layer on the epitaxial layer;
    depositing an adhesion layer on the dielectric layer;
    etching a window through the adhesion layer and the dielectric layer to the epitaxial layer; and
    depositing boron layers, the boron layers including an upper boron layer and a lower boron layer, wherein the upper boron layer is deposited on the adhesion layer, wherein the lower boron layer is deposited on the epitaxial layer within the window, wherein the boron layers are p-type semiconductors, wherein the upper boron layer is separated from the lower boron layer by the dielectric layer, wherein the lower boron layer includes a boron concentration of at least 80 percent, wherein the lower boron layer is a pinhole-free film, wherein at least one of an electron or a photon is configured to penetrate the lower boron layer, wherein the lower boron layer, the epitaxial layer, and the silicon layer form a p-n diode.

25. The method of claim 24, wherein the boron layers are deposited using a diborane species, wherein the diborane species does not laterally diffuse along the adhesion layer into the window.

26. The method of claim 24, further comprising removing the upper boron layer and the adhesion layer.

27. A scanning electron microscope comprising:
a detector comprising:
a silicon layer, wherein the silicon layer is monocrystalline silicon and an n-type semiconductor;
an epitaxial layer, wherein the epitaxial layer is deposited on the silicon layer;
a dielectric layer, wherein the dielectric layer is deposited on the epitaxial layer;
an adhesion layer, wherein the adhesion layer is deposited on the dielectric layer, wherein the dielectric layer and the adhesion layer define a window to the epitaxial layer; and
boron layers including an upper boron layer and a lower boron layer, wherein the upper boron layer is deposited on the adhesion layer, wherein the lower boron layer is deposited on the epitaxial layer within the window, wherein the boron layers are p-type semiconductors, wherein the upper boron layer is separated from the lower boron layer by the dielectric layer, wherein the lower boron layer includes a boron concentration of at least 80 percent, wherein the lower boron layer is a pinhole-free film, wherein at least one of an electron or a photon is configured to penetrate the lower boron layer, wherein the lower boron layer, the epitaxial layer, and the silicon layer form a p-n diode by which the detector is configured to detect at least one of the electron or the photon.

28. The scanning electron microscope of claim 27, wherein the detector is annular, wherein the detector defines an aperture through the silicon layer, the dielectric layer, the adhesion layer, and the upper boron layer; and wherein the scanning electron microscope is configured to generate an electron beam and pass the electron beam through the aperture.

29. A detector array comprising:
an array of detectors, wherein the array of detectors comprise:
a silicon layer, wherein the silicon layer is monocrystalline silicon and an n-type semiconductor;
an epitaxial layer, wherein the epitaxial layer is deposited on the silicon layer;
a dielectric layer, wherein the dielectric layer is deposited on the epitaxial layer;
an adhesion layer, wherein the adhesion layer is deposited on the dielectric layer, wherein the dielectric layer and the adhesion layer define a window to the epitaxial layer; and
boron layers including an upper boron layer and a lower boron layer, wherein the upper boron layer is deposited on the adhesion layer, wherein the lower boron layer is deposited on the silicon layer within the window, wherein the boron layers are p-type semiconductors, wherein the upper boron layer is separated from the lower boron layer by the dielectric layer, wherein the lower boron layer includes a boron concentration of at least 80 percent, wherein the lower boron layer is a pinhole-free film, wherein at least one of an electron or a photon is configured to penetrate the lower boron layer, wherein the lower boron layer, the epitaxial layer, and the silicon layer form a p-n diode by which the detectors are configured to detect at least one of the electron or the photon.

* * * * *